United States Patent
Rasmussen et al.

(10) Patent No.: US 6,596,132 B1
(45) Date of Patent: Jul. 22, 2003

(54) PRODUCTION OF TERNARY SHAPE-MEMORY ALLOY FILMS BY SPUTTERING USING A HOT PRESSED TARGET

(75) Inventors: Gregory Keller Rasmussen, Grand Blanc, MI (US); Fenglian Chang, Grand Blanc, MI (US); Jinping Zhang, Grand Blanc, MI (US); Terry Jack Gold, Davison, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/400,581

(22) Filed: Sep. 22, 1999

(51) Int. Cl.[7] .............................. C23C 14/32; B22F 1/02
(52) U.S. Cl. ............................ 204/192.15; 204/192.12; 204/298.13; 204/192.16; 204/192.17; 419/38
(58) Field of Search ....................... 204/192.12–192.15, 204/298.13, 192.16–192.17; 419/38

(56) References Cited

U.S. PATENT DOCUMENTS

| | | | |
|---|---|---|---|
| 4,824,481 A | * 4/1989 | Chatterjee et al. | ..... 204/298.13 |
| 4,960,651 A | 10/1990 | Pettigrew et al. | ........... 428/607 |
| 5,061,914 A | 10/1991 | Busch et al. | ................. 337/140 |
| 5,108,523 A | 4/1992 | Peterseim et al. | .......... 148/402 |
| 5,114,504 A | 5/1992 | AbuJudom, II et al. | .... 148/402 |
| 6,033,536 A | * 3/2000 | Ichihara et al. | ........ 204/192.15 |

FOREIGN PATENT DOCUMENTS

| EP | 0 640 964 A1 | 3/1995 |
|---|---|---|
| WO | WO 96/39547 | 12/1996 |
| WO | WO 01/21851 A1 | 3/2001 |

OTHER PUBLICATIONS

Angst. D. R. ; Thoma, P. E. ; Kao, M. Y. ; The effect of Hafnium content on the transformation temperatures of Ni49Ti51–xHfx shape memory alloys; J. Phys. IV (1995), 5 (C8, International Conference on Martensitic Transformations, Pt.2 ),747–52, (Abstract).*

Brian Chapman: "Glow Discharge Processes Spluttering and Plasma Etching"; A Wiley–Interscience Publication, John Wiley & Sons, New York, 1980, p. 188.

L. You, C.Y. Chung, X.D. Han and H.D. Gu; "Investigation of High Transition Temperatures NiTiHf Shape Memory Alloy Thin Films for Micro–Actuators"; Proceedings of the Second International Conference on Shape Memory and Superelastic Technologies. Asilomar Conference Center, Pacific Grove, California, USA, pp. 189–194 (1997).

M. Kohl, D. Dittman, E. Quandt, B. Winzek; Sensors and Actuators 83 (2000) 214–219, "Thin film shape memory microvalves with adjustable operation temperature".

K. Nomura, S. Miyazaki and A. Ishida, "Effect of Plastic Strain on Shape Memory Characteristics in Sputter–Deposited Ti–Ni Thin Films", Journal De Physique IV, Colloque C8, supplement au Journal de Physique III, vol. 5, Dec. 1995, pp. C8–695 to C8–700.

(List continued on next page.)

*Primary Examiner*—Mark F. Huff
*Assistant Examiner*—Daborah Chacko-Davis
(74) *Attorney, Agent, or Firm*—Patrick M. Griffin

(57) ABSTRACT

A method for producing thin film deposits of ternary shape-memory alloys using an ion sputtering deposition process comprising using a hot pressed metal powder composition target.

9 Claims, 1 Drawing Sheet

OTHER PUBLICATIONS

Figure 1:
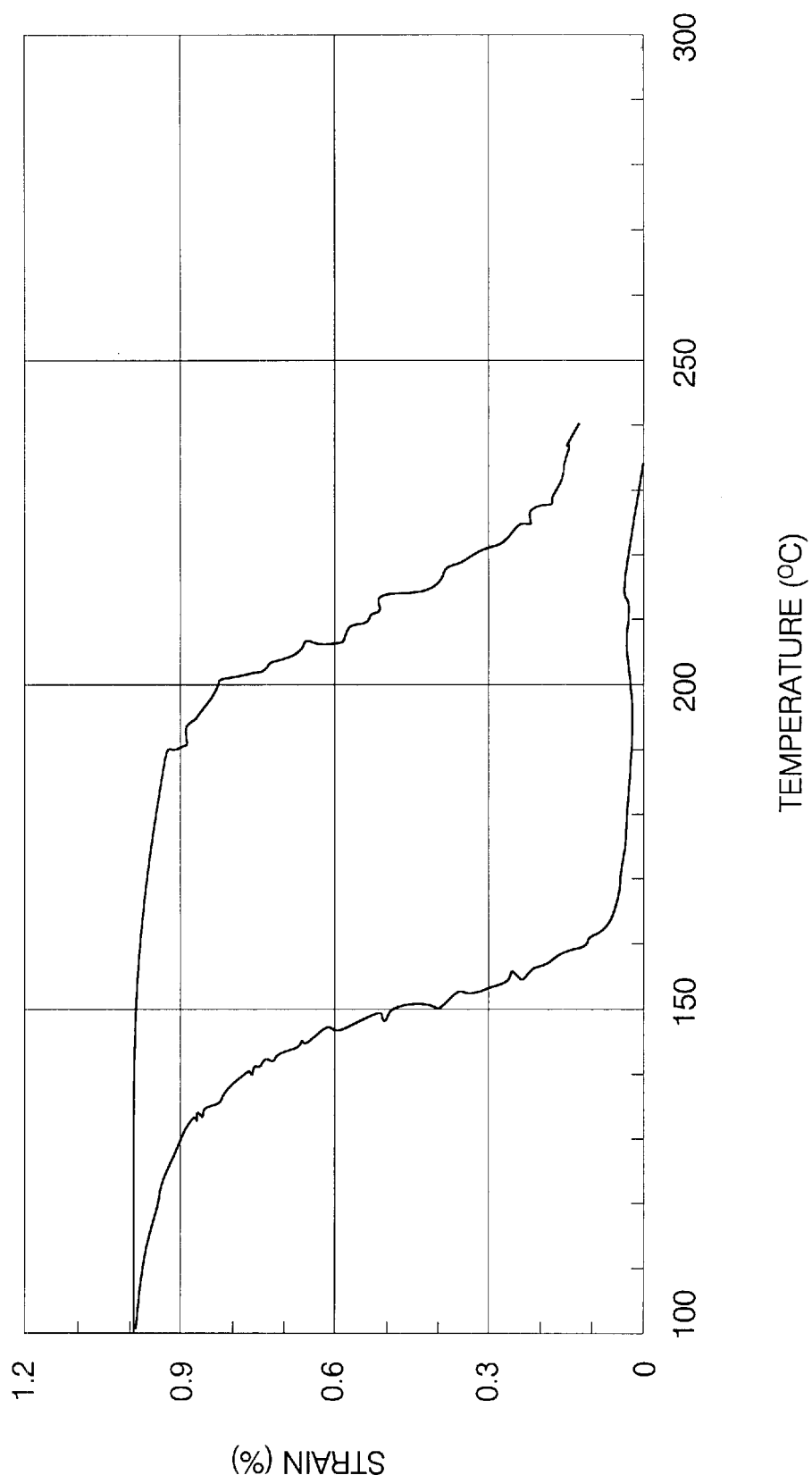

A. Ishida, M. Sato, A. Takei, K. Nomura, and S. Miyazaki, "Effect of Aging on Shape Memory Behavior of Ti–51.3 At. Pct Ni Thin Films", Metallurgical and Materials Transactions A, vol. 27A, Dec. 1996, pp. 3753–3759.

S. Miyazaki and K. Nomura, "Development of Perfect Shape Memory Effect in Sputter–Deposited Ti–Ni Thin Films", Proc. IEEE Micro Electro Mechanical Systems (MEMS–94), Oiso, Japan, (1994), pp. 176–181.

Akira Ishida, Morio Sato, Atsushi Takei, and Shuichi Miyazaki, "Effect of Heat Treatment on Shape Memory Behavior of Ti–rich Ti–Ni Thin Films", Materials Transactions, JIM, vol. 36, No. 11 (1995), pp. 1349–1355.

S.A. Mathews, Manfred Wuttig, and Quanmin Su, "The Effect of Substrate Constraint on the Martensitic Transformation of Ni–Ti Thin Films", Metallurgical and Materials Transactions A, vol. 27A, Sep. 1996, pp. 2859 to 2861.

X. D. Han, W. H. Zou, R. Wang, Z. Zhang, D. Z. Yang, and K. H. Wu, "The Martensite Structure and Aging Precipitates of a TiNiHf High Temperature Shape Memory Alloy", Journal De Physique IV, Colloque C8, supplement au Journal de Physique III, vol. 5, Dec. 1995, pp. C8–753 to C8–758.

D. S. Grummon and T. J. Pence, "Thermotractive Titanium–Nickel Thin Films For Microelectromechanical Systems And Active Composites", Mat. Res. Soc. Symp. Proc. vol. 459 © 1997 Materials Research Society, pp. 331 to 343.

D. S. Grummon, Li Hou, Z. Zhao, and T.J. Pence, "Progress on Sputter–Deposited Thermotractive Titanium–Nickel Films", Journal De Physique IV, Colloque C8, supplement au Journal de Physique III, vol. 5, Dec. 1995, pp. C8–665 to C8–670.

A.D. Johnson, V. V. Martynov, and R. S. Minners, "Sputter Deposition of High Transition Temperature Ti–Ni–Hf Alloy Thin Films", Journal De Physique IV, Colloque C8, supplement au Journal de Physique III, vol. 5, Dec. 1995, pp. C8–783 to C8–801.

* cited by examiner

PRODUCTION OF TERNARY SHAPE-MEMORY ALLOY FILMS BY SPUTTERING USING A HOT PRESSED TARGET

TECHNICAL FIELD

This invention relates to a method of producing ternary shape-memory alloy films by sputtering process techniques. In particular it relates to a method of producing shape-memory nickel titanium hafnium films using hot pressed metal targets in the sputtering process.

BACKGROUND OF THE INVENTION

Various metallic materials capable of exhibiting shape-memory characteristics are well known in the art. These shape-memory capabilities occur as the result of the metallic alloy undergoing a reversible crystalline phase transformation from one crystalline state to another crystalline state with a change in temperature and/or external stress. In particular, it was discovered that alloys of nickel and titanium exhibited these remarkable properties of being able to undergo energetic crystalline phase changes at ambient temperatures, thus giving them a shape-memory. These alloys, if plastically deformed while cool, will revert, exerting considerable force, to their original, undeformed shape when warmed. These energetic phase transformation properties render articles made from these alloys highly useful in a variety of applications. An article made of an alloy having a shape memory can be deformed at a low temperature from its original configuration, but the article "remembers" its original shape, and returns to that shape when heated.

For example, in nickel titanium alloys possessing shape-memory characteristics, the alloy undergoes a reversible transformation from an austenitic state to a martensitic state with a change in temperature. This transformation is often referred to as a thermoelastic martensitic transformation. The reversible transformation of the Ni Ti alloy between the austenite to the martensite phases occurs over two different temperature ranges which are characteristic of the specific alloy. As the alloy cools, it reaches a temperature ($M_s$) at which the martensite phase starts to form, and finishes the transformation at a still lower temperature ($M_f$). Upon reheating, it reaches a temperature ($A_s$) at which austenite begins to reform and then a temperature ($A_f$) at which the change back to austenite is complete. In the martensitic state, the alloy can be easily deformed. When sufficient heat is applied to the deformed alloy, it reverts back to the austenitic state, and returns to its original configuration.

Shape-memory materials previously have been produced in bulk form, in the shape of wires, rods, and plates, for utilities such as pipe couplings, electrical connectors, switches, and actuators, and the like. Actuators previously have been developed, incorporating shape-memory alloys or materials, which operate on the principal of deforming the shape-memory alloy while it is below its phase transformation temperature range and then heating it to above its transformation temperature range to recover all or part of the deformation, and, in the process of doing so, create moments of one or more mechanical elements. These actuators utilize one or more shape-memory elements produced in bulk form, and, therefore are limited in-size and usefulness.

The unique properties of shape-memory alloys further have been adapted to applications such as micro-actuators by means of thin film technology. Micro-actuators are desirable for such utilities as opening and closing valves, activating switches, and generally providing motion for micro-mechanical devices. It is reported that the advantageous performance of micro-actuators is attributed to the fact that the shape-memory effect of the stress and strain can produce substantial work per unit of volume. For example, the work output of nickel-titanium shape-memory alloy is of the order of 1 joule per gram per cycle. A shape-memory film micro-actuator measuring one square millimeter and ten microns thick is estimated to exert about 64 microjoules of work per cycle.

The most well known and most readily available shape-memory alloy is an alloy of nickel and titanium. With a temperature change of as little as about 10° C., this alloy can exert a force of as much as 415 MPa when applied against a resistance to changing its shape from its deformation state.

Although numerous potential applications for shape-memory alloys now require materials featuring phase transformation temperatures above about 100° C., the martensite start point for the common commercially available nickel-titanium alloys barely exceeds about 80° C. In order to meet higher temperature applications, ternary alloys have been investigated, using various additional metallic elements. For example, substitution of noble metals (Au, Pd, Pt) for Ni in NiTi alloys successfully accomplishes higher temperature phase transformations, but the costs introduced are somewhat prohibitive for many commercial applications. Ternary nickel-titanium shape-memory alloys including a zirconium or hafnium component appear to be potentially economical high temperature shape-memory candidates. However, there exists a challenge to develop a reliable process for producing microns-thick, thin films of these high temperature shape-memory alloys.

SUMMARY OF THE INVENTION

Now an improved process for fabricating ternary shape-memory alloy thin films using sputtering techniques has been developed.

According to the present invention, there is provided a method for producing a thin film deposit of a ternary shape-memory alloy film wherein a hot pressed metal target is employed during the sputtering process.

While the use of hot pressed targets in a sputtering process for producing thin films is a previously practiced technique, the use of such target materials in producing shape-memory alloy films has not been recognized as a viable approach. The inherent porosity of a pressed powder composition dictated against the use of hot pressed targets for thin film sputtering of shape-memory alloys, because of the potential for trapped oxygen. Oxygen contamination impacts thin film properties, such as mechanical, electrical, and optical properties. For shape-memory alloys, oxygen contamination becomes particularly detrimental because it dramatically affects transition temperatures and mechanical performance.

Phase transition temperatures and shape-memory properties of NiTi shape-memory alloys are very sensitive to the composition. It was found that 1 at % of redundant nickel could decrease Ms temperature by 100° C., and the redundant titanium could substantially degrade the mechanical properties of the material. To ensure consistent transition temperatures and good shape-memory effect ("SME") properties, composition control is the key. In NiTi thin film fabrication processing by sputtering, the first source of composition variation of thin film is from target. Therefore, target composition has to be closely controlled.

To minimize oxygen contamination, typically, sputtering targets for shape-memory alloy films are fabricated using alloy process techniques involving numerous steps including melting, remelting, solidification, and even long-time homogenization treatment. Because very high temperature has to be used, these procedures often result in the preferential loss of one or more elements to the others, and the compositional control becomes very difficult. Along with high cost and long processing time, the difficulty in compositional control makes this target-making process very impractical, especially when making large size targets.

According to the present process, a homogenous target for sputtering deposition is accomplished by using hot pressing powder metallurgy techniques. In addition to quicker and easier fabrication, and significantly facilitated compositional control, it unexpectedly has been found that ternary shape-memory alloy thin films produced by sputtering using such hot pressed targets exhibit good mechanical properties and shape-memory effect, as well as widely ranged phase transition temperatures.

DESCRIPTION OF AN EMBODIMENT OF THE INVENTION

In a sputtering process, as in the present invention, the sputtering deposition generally takes place in a chamber, such as a Perkin Elmer chamber. The particular process parameters for sputtering deposition are dependent on the specific sputtering equipment employed. An initial base vacuum pressure first is established; this pressure ranges from about $5 \times 10^{-6}$ torr or lower. Preferably, the base vacuum pressure ranges from about $1 \times 10^{-6}$ to about $1 \times 10^{-7}$ torr.

During the ion sputtering process, ionization process gas should be maintained at a pressure ranging from about 0.1 to about 10 mTorr. Preferably, process gas pressure ranges from about 0.5 mTorr to about 5 mTorr. The ionizing process gas may be any typical sputtering process gas such as argon, krypton, or xenon. The preferred process gas is argon. Power applied during sputtering should range between about 50 watts to about 10 kilowatts; preferably the power applied ranges from about 300 watts to about 3000 watts.

Thin films having a wide range of compositions and thicknesses can be deposited using the present process. Preferred ternary alloy thin film compositions are nickel titanium hafnium alloy compositions ranging between $Ni_{45}(TiHf)_{55}$ and $Ni_{55}(TiHf)_{45}$; particularly preferred are alloy compositions ranging between $Ni_{48}(TiHf)_{52}$ and $Ni_{50}(TiHf)_{50}$. Film thicknesses ranging from about 1 micron to about 10 microns are preferred; particularly preferred are deposited film thicknesses ranging from about 3.5 microns to about 4.5 microns.

Pursuant to the present process, hot pressed metal targets having an elemental composition approximately 2 at % less of Ni than that of the desired alloy film to be deposited are utilized, based on the empirical results of composition shift between deposited film and the target. Nickel Titanium based ternary metal target compositions are preferred. Such compositions include NiTi and Au, Pt, Pd, Zr, or Hf compositions. Particularly preferred are Ni Ti Hf compositions. These targets can be fabricated by first mixing nickel, titanium, and hafnium powders in the desired proportions together. After thoroughly blending the powder mixture and degassing, the blend is dispensed into a target mold in vacuum conditions and heated to a high temperature ranging from about 1100° C. to 1300° C., preferably about 1250° C., and pressure is applied generally ranging from about 0 to about 200 MPa. It is preferred to process the targets at a pressure of about 100 MPa in order to minimize the porosity of the target composition.

The following examples are provided to further describe the invention. The examples are intended to be illustrative and are not to be construed as limiting the scope of the invention.

EXAMPLE 1

8"-diameter targets with different NiTiHf ternary compositions were prepared by hot pressing method. Based on the empirical composition shift between thin film and target, compositions of the targets were selected in order to make slightly Ti rich films. Hot pressing was accomplished by standard procedure and the final density of the target was measured to determine fraction of porosity. Table A shows the composition of targets that were used for this study, their theoretical and measured density, and the fraction of porosity calculated accordingly. To protect targets from oxygen contamination, they were sealed in Ar until ready to be put into vacuum chamber.

TABLE A

Target composition, final density and calculated porosity

| Composition of Target | $Ni_{47.5}Ti_{29.5}Hf_{23}$ | $Ni_{47.5}Ti_{32.5}Hf_{20}$ | $Ni_{47.5}Ti_{34.5}Hf_{18}$ | $Ni_{48.5}Ti_{35.5}Hf_{16}$ |
|---|---|---|---|---|
| Theoretical Density (g/cc) | 8.83 | 8.49 | 8.27 | 8.08 |
| Density Measured (g/cc) | 7.46 | 6.91 | 7.24 | 7.16 |
| Porosity (%) | 15.5 | 18.6 | 12.5 | 11.4 |

Ni Ti Hf ternary films with different compositions were sputter deposited on 5"-diameter oxide passivated Si substrates from the hot pressed targets. Deposition parameters included: base pressure $5 \times 10^{-7}$ torr before deposition, working gas Ar pressure 1.5 mTorr during deposition, target-to-substrate distance 3.2 inches, deposition power 1 kW, substrate temperature 400~420° C. and deposition time 53 minutes. The thickness of thin film was about 4.5 μm. Chemical composition of the film around wafer center was measured by x-ray Energy Dispersive Spectrum (EDS) equipped on a Scanning Electron Microscope (SEM), and the transformation temperatures were measured by Differential Scanning Calorimetry (DSC). The composition and the transition temperatures of film deposited from each target are shown in Table B. It is indicated that as the hafnium content goes up, transformation temperatures increase accordingly.

TABLE B

Composition and Transition Temperatures of Ternary Films Sputtering From Different Targets.

| | Target Composition | | | |
|---|---|---|---|---|
| | $Ni_{47.5}Ti_{29.5}Hf_{23}$ | $Ni_{47.5}Ti_{32.5}Hf_{20}$ | $Ni_{47.5}Ti_{34.5}Hf_{18}$ | $Ni_{48.5}Ti_{35.5}Hf_{16}$ |
| | Film Composition | | | |
| | $Ni_{48.9}Ti_{25.8}Hf_{25.3}$ | $Ni_{48.7}Ti_{29.2}Hf_{22.1}$ | $Ni_{48.8}Ti_{33.4}Hf_{17.8}$ | $Ni_{49.7}Ti_{33.9}Hf_{16.4}$ |
| $M_s$ (° C.) | 260 | 200 | 165 | 150 |
| $M_f$ (° C.) | 195 | 160 | 135 | 125 |
| $A_s$ (° C.) | 305 | 230 | 190 | 180 |
| $A_f$ (° C.) | 350+ | 260 | 235 | 200 |

Mechanical and shape-memory properties of the deposit were evaluated by tensile testing at room temperature and thermal cycling under constant load. Thin film was mechanically delaminated from the substrate and cut to 3 mm×30 mm dimension. At strain rate of ~0.015/min, the fracture strength was close to 350 MPa. Thermal cycling was conducted under constant load at different stress levels with temperature from 100° C. and 300° C. It was found the maximum sustainable stress for thermal cycling was close to 250 MPa. Strain-temperature hysteresis loop was observed during stressed thermal cycling, and the recoverable strain was up to 1%. FIG. 1 shows the typical strain-temperature curve of a $Ni_{49.7}Ti_{33.9}Hf_{16.4}$ thin film.

Although the shape-memory properties of the sputtered NiTiHf ternary films were not comparable to sputtered NiTi binary films, this is not surprising because bulk NiTiHf exhibits shape-memory properties far inferior to the bulk binary thin films. Surprisingly, pursuant to the method of the present invention, it has been discovered that successful NiTiHf SMA deposition can be accomplished showing quantitative SME properties, which demonstrates that a hot pressed target can be used to make NiTiHf ternary SMA thin films. In addition, by using krypton as working gas, NiTiHf film exhibited perfect SME as large as 2.5%.

Various other embodiments or other modifications of the disclosed embodiments will be apparent to those skilled in the art upon reference to this description, or may be made without departing from the spirit and scope of the invention defined in the appended claims.

What is claimed is:

1. A method for producing a thin film alloy deposit comprising:

A process of ion sputtering a hot pressed metal powder composition target fabricated from nickel, titanium, and hafnium metal powders to have an atomic ratio ranging between $Ni_{45}$ $(TiHf)_{55}$ and $Ni_{55}$ $(TiHf)_{45}$, to produce a NiTiHf ternary shape-memory thin film alloy.

2. The method of claim 1 wherein the hot pressed target is fabricated from nickel, titanium, and hafnium metal powders to have an atomic ratio ranging between $Ni_{48}$ $(TiHf)_{52}$ and $Ni_{50}$ $(TiHf)_{50}$.

3. The method of claim 1 wherein a process gas comprising argon is used during the sputtering deposition process.

4. The method of claim 3 wherein the argon process gas has a pressure ranging from about 0.5 mTorr to about 5 mTorr.

5. The method of claim 1 wherein the sputtering process is conducted at an applied power of about 50 watts to about 10000 watts.

6. The method of claim 5 wherein the sputtering process is conducted at an applied power of about 300 watts to about 3000 watts.

7. The method of claim 1 comprising using a hot pressed target fabricated by a process comprising mixing nickel, titanium, and hafnium metal powders, degassing the mixture, pressing the mixture to a desired molded shape, and heating the molded shape to a temperature ranging from about 1100° C. to about 1300° C., while applying a pressure ranging up to about 200 MPa.

8. A method of producing a thin film deposit of a ternary shape-memory alloy using an ion sputtering deposition process comprising:

evacuating a deposition chamber to a pressure ranging from about $1\times10^{-6}$ to about $1\times10^{-7}$ torr;

maintaining an argon gas during deposition at a pressure ranging from about 0.5 mTorr to about 5 mTorr;

applying a sputtering power of about 300 watts to about 3000 watts; and using a hot pressed sputtering target comprising a blended metal powder composition comprising nickel, titanium, and hafnium powders having an atomic ratio ranging between $Ni_{45}$ $(TiHf)_{55}$ and $Ni_{55}$ $(TiHf)_{45}$.

9. A method for producing a thin film deposit of a nickel titanium hafnium ternary shape-memory alloy using an ion sputtering deposition process comprising:

conducting the sputtering deposition using a hot pressed metal powder composition target consisting essentially of nickel, titanium, and hafnium metal powders to have an atomic ratio ranging between $Ni_{45}$ $(TiHf)_{55}$ and $Ni_{55}$ $(TiHf)_{45}$.

* * * * *